US009329656B2

(12) United States Patent
Prathaban et al.

(10) Patent No.: US 9,329,656 B2
(45) Date of Patent: *May 3, 2016

(54) APPARATUS, METHOD, AND SYSTEM FOR PREDICITVE POWER DELIVERY NOISE REDUCTION

(71) Applicant: INTEL CORPORATION, Santa Clara, CA (US)

(72) Inventors: Satish Prathaban, Bangalore (IN); Ramaswamy Parthasarathy, Bangalore (IN); Maynard C. Falconer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/223,941

(22) Filed: Mar. 24, 2014

(65) Prior Publication Data
US 2014/0325243 A1    Oct. 30, 2014

Related U.S. Application Data

(63) Continuation of application No. 12/975,105, filed on Dec. 21, 2010, now Pat. No. 8,689,018.

(51) Int. Cl.
G06F 1/28      (2006.01)
G06F 1/30      (2006.01)
G11C 5/14     (2006.01)

(52) U.S. Cl.
CPC  G06F 1/28 (2013.01); G06F 1/305 (2013.01); G11C 5/14 (2013.01)

(58) Field of Classification Search
CPC .............. G06F 1/28; G06F 1/305; G11C 5/14
See application file for complete search history.

(56) References Cited

U.S. PATENT DOCUMENTS

| 5,856,755 | A  | 1/1999  | Falconer |
| 6,204,683 | B1 | 3/2001  | Falconer |
| 6,249,142 | B1 | 6/2001  | Hall et al. |
| 6,577,179 | B2 | 6/2003  | Falconer |
| 6,587,323 | B1 | 7/2003  | Falconer |
| 6,741,165 | B1 | 5/2004  | Langfahl et al. |
| 6,774,819 | B1 | 8/2004  | Falconer |
| 6,794,895 | B2 | 9/2004  | Falconer |
| 6,834,109 | B1 | 12/2004 | Pare, Jr. et al. |
| 6,870,901 | B1 | 3/2005  | Gudmundsson et al. |
| 6,970,415 | B1 | 11/2005 | Galarza et al. |
| 6,970,560 | B1 | 11/2005 | Hench et al. |
| 6,978,015 | B1 | 12/2005 | Erickson et al. |
| 7,076,677 | B2 | 7/2006  | Falconer |
| 7,098,670 | B2 | 8/2006  | Cole |
| 7,349,480 | B2 | 3/2008  | Tsatsanis |
| 7,522,515 | B2 | 4/2009  | Tsatsanis |
| 7,796,544 | B2 | 9/2010  | Hench |
| 7,864,692 | B1 | 1/2011  | Hench et al. |
| 7,945,050 | B2 | 5/2011  | Mozak |
| 8,139,658 | B2 | 3/2012  | Tsatsanis et al. |
| 8,503,678 | B2 | 8/2013  | Falconer |
| 2005/0194981 | A1 | 9/2005  | Cole |
| 2006/0226854 | A1 | 10/2006 | Cole |
| 2009/0017761 | A1 | 1/2009  | Li et al. |
| 2010/0003938 | A1 | 1/2010  | Hunter et al. |
| 2012/0076007 | A1 | 3/2012  | Nelson |
| 2012/0159226 | A1 | 6/2012  | Prathaban et al. |

Primary Examiner — M Elamin
(74) Attorney, Agent, or Firm — Vecchia Patent Agent, LLC

(57) ABSTRACT

An apparatus and method is described herein for reducing noise in a power distribution network for an interface. The power distribution network is characterized. And based on that characterization, worst case patterns for the interface are predicted and avoided. As one example, characterization includes providing a stimulus, such as a step function stimulus, and determining a mathematical function response, such as a step function response. Then, based on the step function response, a resonant frequency for the power distribution network is determined; from which patterns that cause the resonant frequency are identified/predicted. And when identified patterns are detected, they are scrambled or manipulated to avoid causing a worst-case noise scenario in an interface's power distribution network.

22 Claims, 6 Drawing Sheets

Impedance profile of Power Delivery Network 305

Step Current Pulse 310

Step response of Power Delivery Network 315

APPARATUS, METHOD, AND SYSTEM FOR PREDICITVE POWER DELIVERY NOISE REDUCTION

CROSS-REFERENCE TO RELATED APPLICATIONS

The present patent application is a Continuation of U.S. patent application No. 12/975,105 filed on Dec. 21, 2010, now U.S. Pat. No. 8,689,018, is hereby incorporated herein by reference.

FIELD

This invention relates to the field of integrated circuits and, in particular, to improving power delivery.

BACKGROUND

Advances in semi-conductor processing and logic design have permitted an increase in the amount of logic that may be present on integrated circuit devices. As a result, the power demands of integrated circuits, such as microprocessors, have drastically increased. Typically there have been two approaches to handling this voltage supply degradation. In one post-design scenario, a large amount of decoupling capacitors are added to a processor package and/or motherboard to reduce voltage droops. Yet, adding capacitors is both monetarily expensive (extra money per capacitor) and physically expensive (the capacitors take up additional critical signal routing/placement space). In a second, pre-design scenario, processor designers take into account the voltage supply issues by adding a guard-band (a tolerance band that the processor still operates appropriately). However, an increase in guard-band both results in an additional power losses and performance degradation, since the designers are constrained by designing to worst case scenarios.

As one example of such a worst case scenario, input/output (I/O) patterns that cause resonant frequencies on I/O interfaces potentially cause noise in an associated power delivery network. In fact, as the I/O speeds of devices increases, power delivery noise targets shrink, accordingly. And as the power delivery noise targets decrease, the need for more on-die decoupling capacitors increase, which results in even more expense. Unfortunately, current scramblers only provide random pattern scrambling without consideration of a patterns affect on a power delivery network.

BRIEF DESCRIPTION OF THE DRAWINGS

The present invention is illustrated by way of example and not intended to be limited by the figures of the accompanying drawings.

DETAILED DESCRIPTION

In the following description, numerous specific details are set forth, such as examples of specific types of specific processor configurations, specific mathematical function responses, specific hardware structures, specific logic states, specific step stimuli, etc. in order to provide a thorough understanding of the present invention. It will be apparent, however, to one skilled in the art that these specific details need not be employed to practice the present invention. In other instances, well known components or methods, such as specific and alternative processor architecture, specific logic circuits/code for described algorithms, specific I/O interface, specific power delivery components, and other specific operational details of processors haven't been described in detail in order to avoid unnecessarily obscuring the present invention.

The method and apparatus described herein are for predictive noise reduction in power distribution networks. Specifically, predictive noise reduction is discussed primarily in reference to processor input/output (I/O) interfaces, such as external interconnect I/O interfaces for communicating with external devices or I/O interfaces for communication between parts/sections of a processor. Yet, the apparatus' and methods described herein are not so limited, as they may be implemented in conjunction with any power delivery network for an interface or device. For example, the predictive noise reduction may be utilized in a computer system's power delivery network or other device (a chipset, I/O device, graphics card, etc.) within a computer system. Or the predictive noise reduction may be utilized in embedded, small form-factor devices, such as PDAs and cell phones.

Figure 1:
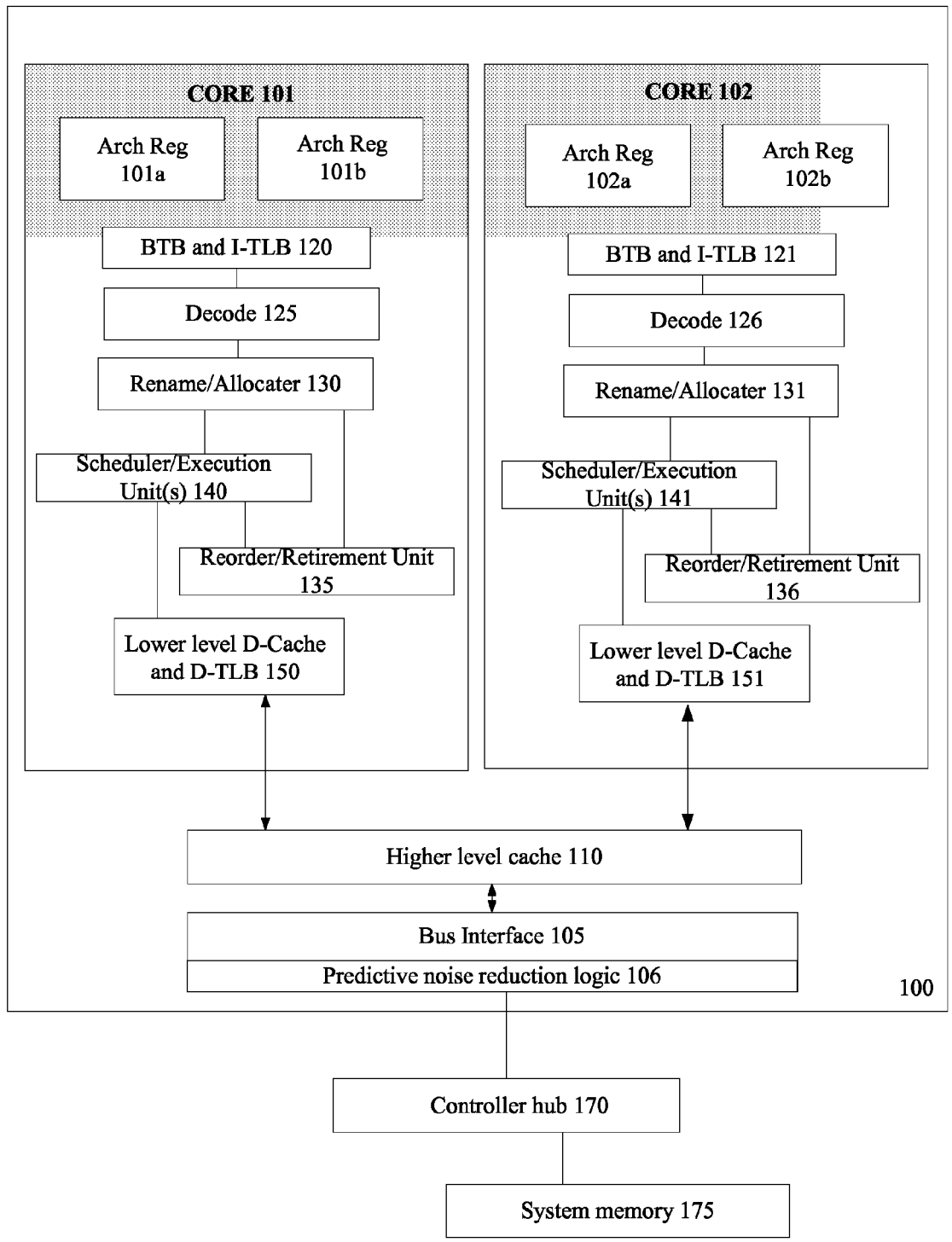
FIG. 1 illustrates an embodiment of a logical representation of a multiprocessing element processor.

Referring to FIG. 1, an embodiment of a processor including multiple cores is illustrated. Processor 100 includes any processor, such as a microprocessor, an embedded processor, a digital signal processor (DSP), a network processor, or other device to execute code. Processor 100, in one embodiment, includes at least two cores—core 101 and 102, which may include asymmetric cores or symmetric cores (illustrated embodiment). However, processor 100 may include any number of processing elements that may be symmetric or asymmetric.

In one embodiment, a processing element refers to a thread unit, a thread slot, a process unit, a context, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor typically refers to an integrated circuit, which potentially includes any number of other processing elements, such as cores or hardware threads.

A core often refers to logic located on an integrated circuit capable of maintaining an independent architectural state wherein each independently maintained architectural state is associated with at least some dedicated execution resources. In contrast to cores, a hardware thread typically refers to any logic located on an integrated circuit capable of maintaining an independent architectural state wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 100, as illustrated in FIG. 1, includes two cores, core 101 and 102. Here, core 101 and 102 are considered symmetric cores, i.e. cores with the same configurations, functional units, and/or logic. In another embodiment, core 101 includes an out-of-order processor core, while core 102 includes an in-order processor core. However, cores 101 and 102 may be individually selected from any type of core, such as a native core, a software managed core, a core adapted to execute a native Instruction Set Architecture (ISA), a core adapted to execute a translated Instruction Set Architecture (ISA), a co-designed core, or other known core. Yet to further the discussion, the functional units illustrated in core 101 are described in further detail below, as the units in core 102 operate in a similar manner.

As depicted, core 101 includes two hardware threads 101a and 101b, which may also be referred to as hardware thread slots 101a and 101b. Therefore, software entities, such as an operating system, in one embodiment potentially view processor 100 as four separate processors, i.e. four logical processors or processing elements capable of executing four software threads concurrently. As eluded to above, a first thread is associated with architecture state registers 101a, a second thread is associated with architecture state registers 101b, a third thread may be associated with architecture state registers 102a, and a fourth thread may be associated with architecture state registers 102b. As illustrated, architecture state registers 101a are replicated in architecture state registers 101b, so individual architecture states/contexts are capable of being stored for logical processor 101a and logical processor 101b. In core 101, other smaller resources, such as instruction pointers and renaming logic in rename allocator logic 130 may also be replicated for threads 101a and 101b. Some resources, such as reorder buffers in reorder/retirement unit 135, ILTB 120, load/store buffers, and queues may be shared through partitioning. Other resources, such as general purpose internal registers, page-table base register, low-level data-cache and data-TLB 115, execution unit(s) 140, and portions of out-of-order unit 135 are potentially fully shared.

Processor 100 often includes other resources, which may be fully shared, shared through partitioning, or dedicated by/to processing elements. In FIG. 1, an embodiment of a purely exemplary processor with illustrative logical units/resources of a processor is illustrated. Note that a processor may include, or omit, any of these functional units, as well as include any other known functional units, logic, or firmware not depicted. As illustrated, core 101 includes a simplified, representative out-of-order (OOO) processor core. The OOO core includes a branch target buffer 120 to predict branches to be executed/taken and an instruction-translation buffer (I-TLB) 120 to store address translation entries for instructions.

Core 101 further includes decode module 125 coupled to fetch unit 120 to decode fetched elements. Fetch logic, in one embodiment, includes individual sequencers associated with thread slots 101a, 101b, respectively. Usually core 101 is associated with a first Instruction Set Architecture (ISA), which defines/specifies instructions executable on processor 100. Here, often machine code instructions that are part of the first ISA include a portion of the instruction (referred to as an opcode), which references/specifies an instruction or operation to be performed. Decode logic 125 includes circuitry that recognizes these instructions from their opcodes and passes the decoded instructions on in the pipeline for processing as defined by the first ISA. For example, as discussed in more detail below decoders 125, in one embodiment, include logic designed or adapted to recognize specific, new instructions, such as a conditional commit instruction and/or a speculative checkpoint instruction. As a result or the recognition by decoders 125, the architecture or core 101 takes specific, predefined actions to perform tasks associated with the appropriate instruction.

In one example, allocator and renamer block 130 includes an allocator to reserve resources, such as register files to store instruction processing results. However, threads 101a and 101b are potentially capable of out-of-order execution, where allocator and renamer block 130 also reserves other resources, such as reorder buffers to track instruction results. Unit 130 may also include a register renamer to rename program/instruction reference registers to other registers internal to processor 100. Reorder/retirement unit 135 includes components, such as the reorder buffers mentioned above, load buffers, and store buffers, to support out-of-order execution and later in-order retirement of instructions executed out-of-order.

Scheduler and execution unit(s) block 140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 150 are coupled to execution unit(s) 140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 101 and 102 share access to higher-level or further-out cache 110, which is to cache recently fetched elements. Note that higher-level or further-out refers to cache levels increasing or getting further way from the execution unit(s). In one embodiment, higher-level cache 110 is a last-level data cache—last cache in the memory hierarchy on processor 100—such as a second or third level data cache. However, higher level cache 110 is not so limited, as it may be associated with or include an instruction cache. A trace cache—a type of instruction cache—instead may be coupled after decoder 125 to store recently decoded traces.

In the depicted configuration, processor 100 also includes bus interface module 105 to communicate with devices external to processor 100, such as system memory 175, a chipset, a northbridge, or other integrated circuit. Memory 175 may be dedicated to processor 100 or shared with other devices in a system. Common examples of types of memory 175 include dynamic random access memory (DRAM), static RAM (SRAM), non-volatile memory (NV memory), and other known storage devices.

In one embodiment, processor 100 includes predictive noise reduction logic 106 to reduce noise in a power delivery network for the interface, such as bus interface 105. As an example, noise reduction logic 106 is adapted to characterize a power delivery network associated with bus interface 105.

And based on that characterization, one or more worst case patterns for noise on a power distribution network associated with bus interface 105 is identified/predicted. Moreover, upon subsequent detection of such worst case patterns, they may be avoided to reduce noise on the power delivery network.

In one embodiment, characterization of a power delivery network for bus interface 105 includes providing a step function characterization of bus interface 105. Specifically, a step function stimuli, such as pulling I/O cells of bus interface 105 to a specific voltage level (high or low voltage), is provided. And a step function response associated with bus interface 105, such as a recording of voltage of bus interface 105 vs. time, is determined. Here, note that the step function response may be quantified in a time or a frequency domain, such as determining a resonant frequency from the step function response. Then, based on the step function response, one or more patterns that generate noise in a power delivery network associated with bus interface 105 are identified/predicted as patterns to avoid. As a result, when one of the patterns to avoid is to be transmitted on bus interface 105, predictive noise reduction logic 106 detects and manipulates the pattern, such that the noise associated with the pattern is elided. Essentially, predictive noise reduction logic 106 avoids specific bus activity from bus interface 105 to controller hub 170 that hits a resonant frequency of the power delivery network for bus interface 105. And consequently, with the reduction of worst case noise scenarios for the power delivery network, both pre and post-design associated costs are reduced (less decoupling capacitors have to be added to processor 100 and a designed guard-band may be shrunk; this reduction potentially leads to more die space and reduced per unit cost).

Although the discussion of predictive noise reduction has been discussed in reference to an external interface (bus interface 105), predictive noise reduction may be used on any interface between logic, cores, units, etc. of processor 100. Therefore, use of the term input/output (I/O) interface may refer to an interface that communicates externally with another device or internally with another part of a device. For example, predictive noise reduction logic 106 is the included in core 101 for communication with other units, such as higher level cache 110 or core 102. Or, logic 106 may be included between units, such as execution units 140 and lower level data cache 150. In addition, noise reduction logic 106 may also be included in controller hub 170, as well as between other devices, such as on a graphics interconnect, a memory interconnect, an input/output interconnect, or other known interconnect. Essentially, the noise reduction methods and apparatus described herein may be utilized within any known power delivery network.

In addition, characterization of a power delivery network is not limited to description of the network through a mathematical function. Instead, different stimuli, such as different patterns, may be generated and the power distribution network may then be profiled based on the transmitted patterns. From the collected profile information, which may be statically obtained through simulation or dynamically obtained during runtime, specific worst-case noise patterns are identified and avoided.

FIG. 1 illustrates an abstracted, logical view of an exemplary processor with a representation of different modules, units, and/or logic. However, note that a processor utilizing the methods and apparatus' described herein need not include the illustrated units. And, the processor may omit some or all of the units shown. In addition, FIG. 1 only depicts two cores; yet, a processor may include any number of cores, such as multiple cores of the same type, as well as more than two cores that each differ in type.

FIG. 1 illustrates an embodiment of processor that is coupled in a point-to-point fashion with an interface to an external memory controller (controller hub 170). However, many current processors have begun including an on-processor memory interface module—an on-chip module—with a ring configuration to interconnect multiple cores, as well as shared caches and other interfaces. Although not illustrated, processor 100, in one embodiment, includes a ring interconnect coupling core, cache, and memory controller components.

Here, caching agents are utilized to manage a slice of a physically distributed cache. As an example, each cache component is to manage a slice of a cache for a collocated core—a core the cache agent is associated with for purpose of managing the distributed slice of the cache. Much like cache agents handle traffic on a ring interconnect and interface with cache slices, core agents/components are to handle traffic and interface with cores. Additionally, the ring interconnect may couple Memory Controller Interface Logic (MCIL) and/or other controllers to interface with other modules, such memory and/or a graphics processor. As a result, predictive power delivery noise reduction, as described herein, may be utilized between any of the agents, between the on-processor memory interface module and local processing elements, between the on-processor memory interface module and external devices, as well as between any of the agents and the caches and cores they communicate with.

Figure 2:
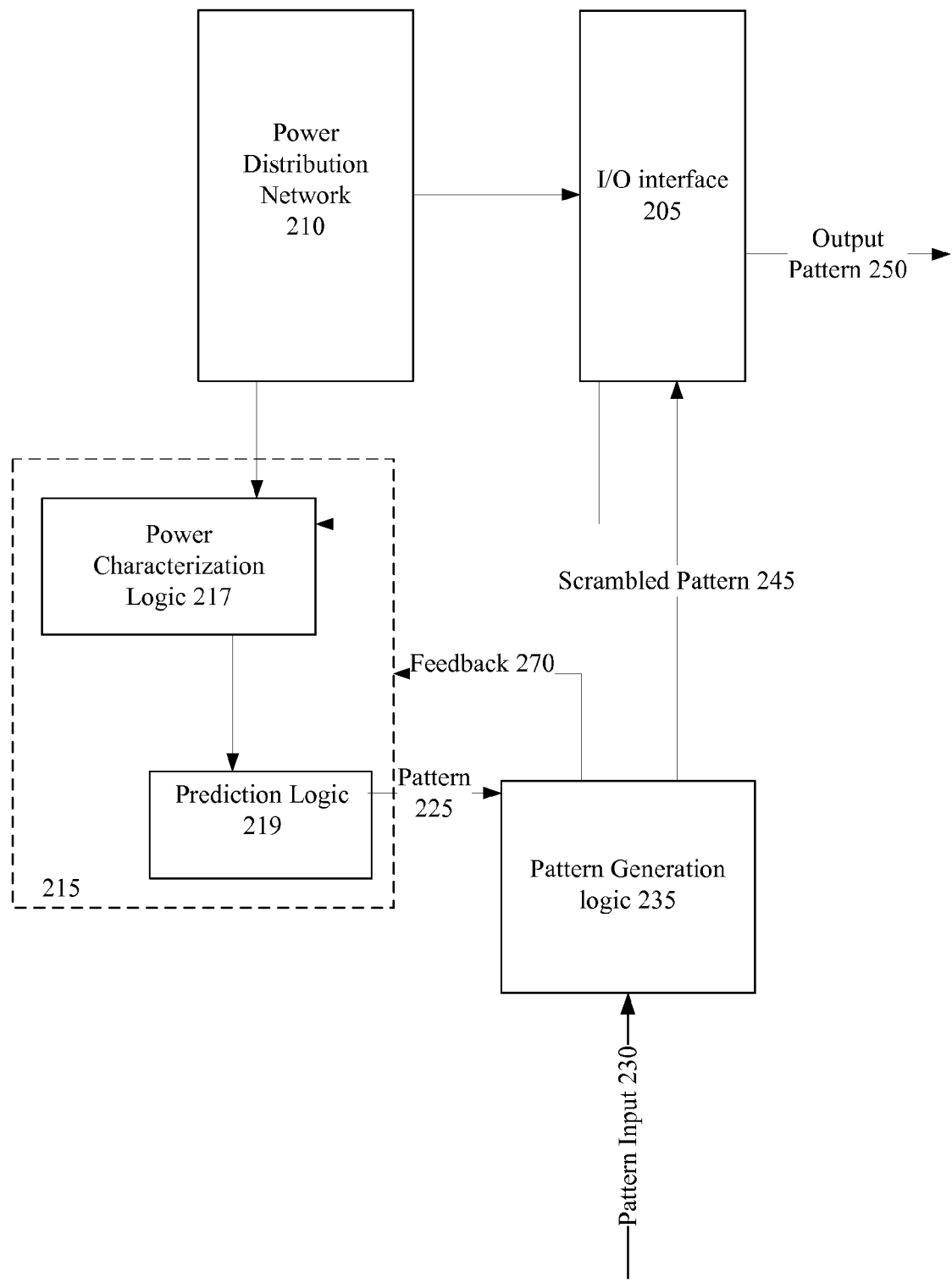
FIG. 2 illustrates an embodiment of predicted noise reduction logic adapted to identify patterns that generate noise in a power distribution network.

Turning to FIG. 2, an embodiment of noise reduction logic to reduce noise in a I/O interface power distribution network is depicted. I/O interface 205 includes any known I/O logic adapted to communicate on an interconnect, which may include any known coupling between devices or logic within devices, as well as communicate over a wireless link. As a purely illustrative example, I/O interface 205 includes logic adapted to communicate over a bidirectional, serial, point-to-point fabric, such as an interconnect adhere to Intel's Quick-Path Technology protocol or a PCT-Express protocol. Here, I/O interface 205 includes transmitter logic and receiver logic to transmit and receive on the interconnect, respectively. Typically, the transmitter and receiver pair is referred to an I/O cell, pair or block.

Often, power distribution network to 210 refers to any distribution logic to deliver voltage/current (power) to interface 205; because of this interconnection to each I/O cell within interface 205, the power demands by one or more cells has an effect on power distribution network 210. For example, transmitters often transmit logical binary values, where a high voltage (e.g. 1 volt) represents a logical one a and a low voltage (e.g. 0.4 volts) represents a logical zero. And as multiple transmitters in interface 205 transition between these voltage levels, the noise generated in network 210 potentially causes adverse power distribution effects (undershoot, droop, overshoot, ringing, etc.). Moreover, specific patterns, such as pattern 250 (a collection of logical values to be transmitted in parallel by multiple transmitters of interface 205), create more noise in network 210 as compared to other patterns; these adverse patterns are often referred to as worse case patterns.

In the illustrative example, pattern input 230 (the binary information from the internal logic to be transmitted through an interconnect) is provided to pattern generation logic 235. Pattern generation logic 235 takes input 230 and formulates a pattern according to a protocol for transmission by interface 225 to an associated interconnect. Previously, a purely random scrambler was sometimes provided to scramble the pattern input in hopes of reducing crosstalk and noise. Yet, these random scramblers only provide 'random' scrambling without any knowledge of the worst case patterns or prediction thereof. As a result, whether scrambled or unscrambled, worst case patterns previously could be unknowingly passed to interface 205. And during transmission such worst case patterns were potentially encountered, causing adverse noise scenarios for power distribution network 210.

In contrast, in one embodiment, predictive noise reduction logic 215 is provided to characterize a power distribution network 210 and predict worst case patterns to avoid based on such characterization. Power characterization logic 217 may include any known logic for characterizing or representing power distribution logic, such as network 210 for interface 205. As one embodiment, characterization logic 217 includes logic adapted to implement a mathematical function or logic to capture a mathematical function response.

As a specific illustrative example, characterization logic 217 includes step function logic adapted to determine the step function response of interface 205 including distribution network 210. Mathematically, a step function often refers to a function of real numbers, which can be written as a finite linear combination of indicator functions of intervals (i.e. a piecewise constant function). In this case, a step function stimuli is provided to interface 205 including distribution network 210. As an example, the step function stimuli includes pulling all I/O's of interface 205 to a specific voltage level (providing a current pulse that causes all I/O cells to pull to the voltage level). In one scenario, the I/O's of interface 205 are all driven high. Or alternatively, the I/O's of interface 205 are pulled low. In yet another example, the I/O cells are driven to any voltage level, such as a nominal or threshold voltage.

Figure 3:
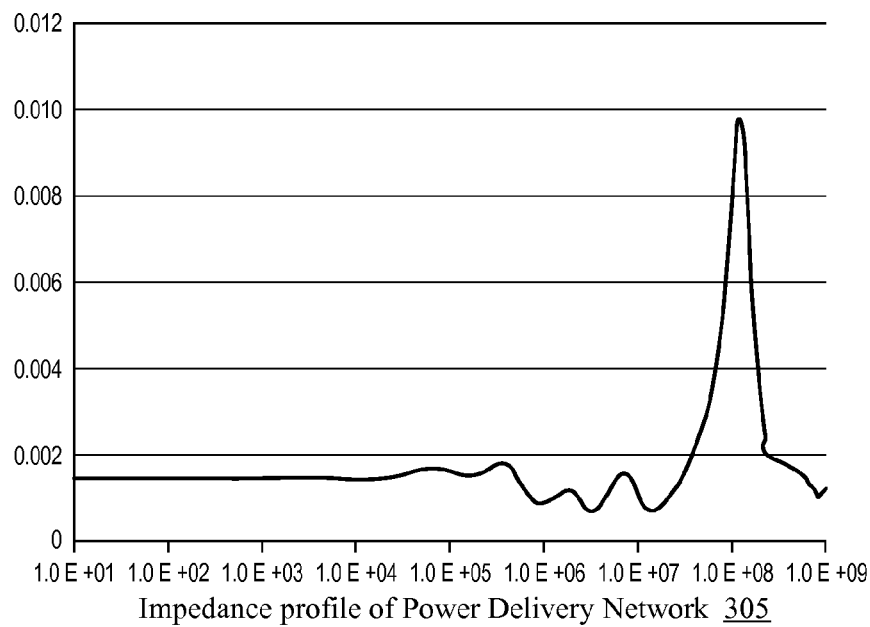
FIG. 3 illustrates an embodiment of an exemplary step response for a power delivery network.
Figure 3:
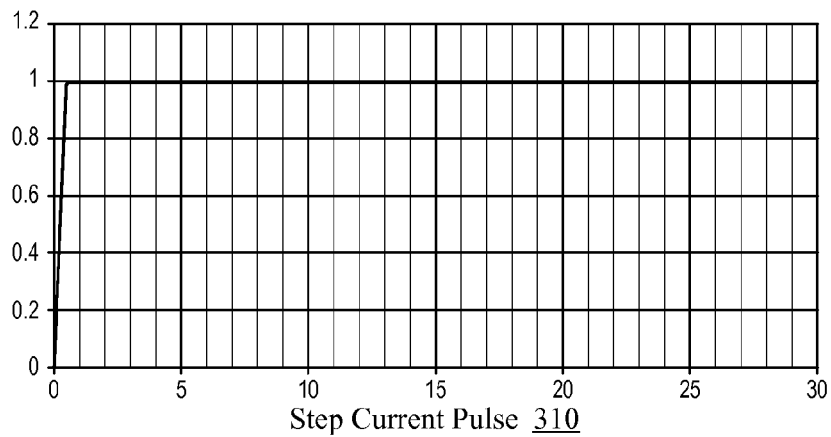
Figure 3:
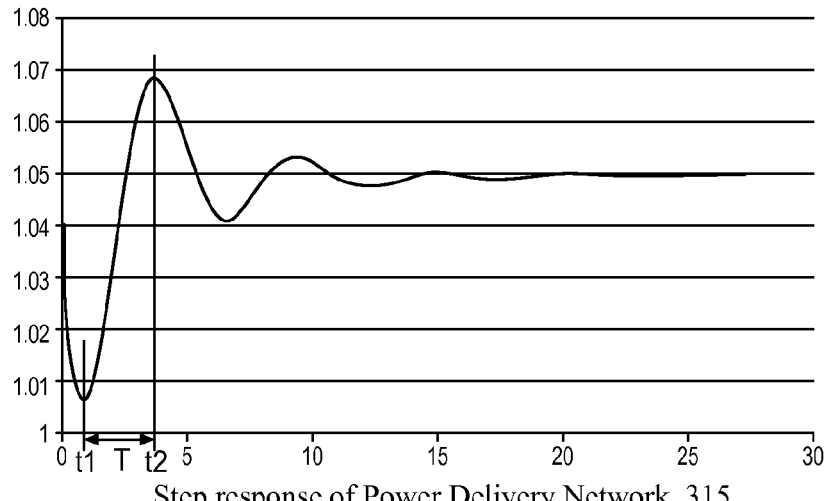

Referring temporarily to FIG. 3, an embodiment of an impedance profile of a power delivery network, such as network 210, is illustrated. Graph 305 illustrates a typical impedance profile of a power delivery network. Additionally, graph 310 illustrates an example of the step function stimuli—a step current pulse—that is provided. And an exemplary step response of a power delivery network is shown in graph 315.

The step function response associated with interface 205 and network 210 is determined by characterization logic 217 and/or prediction logic 219 based on their response to the step function stimuli. In one embodiment, prediction logic 219 is to predict one or more I/O pattern(s) to avoid based on the mathematical function response. In one case, a resonant frequency associated with interface 205 including network 210 is determined. Here, logic, such as frequency determination logic, is to determine the resonant frequency from characterization logic 217's step function response information regarding interface 205. Additionally, in one embodiment, prediction logic 219 also predicts one or more patterns to avoid transmitting through interface 205. In one case, prediction logic 219 predicts the patterns that generate the resonant frequency (the worst case noise scenarios) for interface 205 including network 210 as determined from the step response by characterization logic 217. Note that the discussion above has been primarily in reference to step function responses and resonant frequencies; however, predictive power noise reduction is not so limited. Other mathematical function responses or power network characterization techniques may be utilized.

Regardless of how patterns to avoid, such as pattern 225, are determined; in one embodiment, a scrambler scrambles (manipulates) incoming pattern 230 in response to detecting that incoming pattern 230 matches/includes a pattern to avoid, such as pattern 225. As mentioned above, previous scramblers didn't take into account specific, worst-case patterns to avoid for noise reduction. Yet, in this case, predicted, worst-case patterns are determined based on actual power distribution network characterization. And those worst-case patterns are provided to generation logic 235 to be avoided. As a result, when one of those patterns is to be generated and transmitted through interface 205, generation logic 235 including a structure, such as a scrambler, manipulates pattern 230. However, note that other apparatus and methods to manipulate or avoid a pattern may be used, where a scrambler is not included. As a result, worst-case patterns are not transmitted through interface 205. And by reducing worst-case noise in network 210, the extreme (corner) noise cases may be reduced/eliminated. Consequently, during design and manufacture, a reduced number of decoupling capacitors and a smaller guard band may be used, which increases die space availability and reduces cost per unit.

Although FIG. 2 illustrates most of the discussed hardware centralized in logical box 215, the components discussed herein may be distributed through a device. For example, interface logic 205 may be physically indistinguishable from power distribution network 210, since the network includes components within the interface 205 to deliver current (power). Moreover, pattern generation and power characterization logic may be similarly integrated in interface 205. Essentially, the blocks illustrated in FIGS. 2, 4, and 5 are logical blocks for the purpose of discussion and may be implemented in any known hardware, software, firmware, or a combination thereof.

Figure 4:
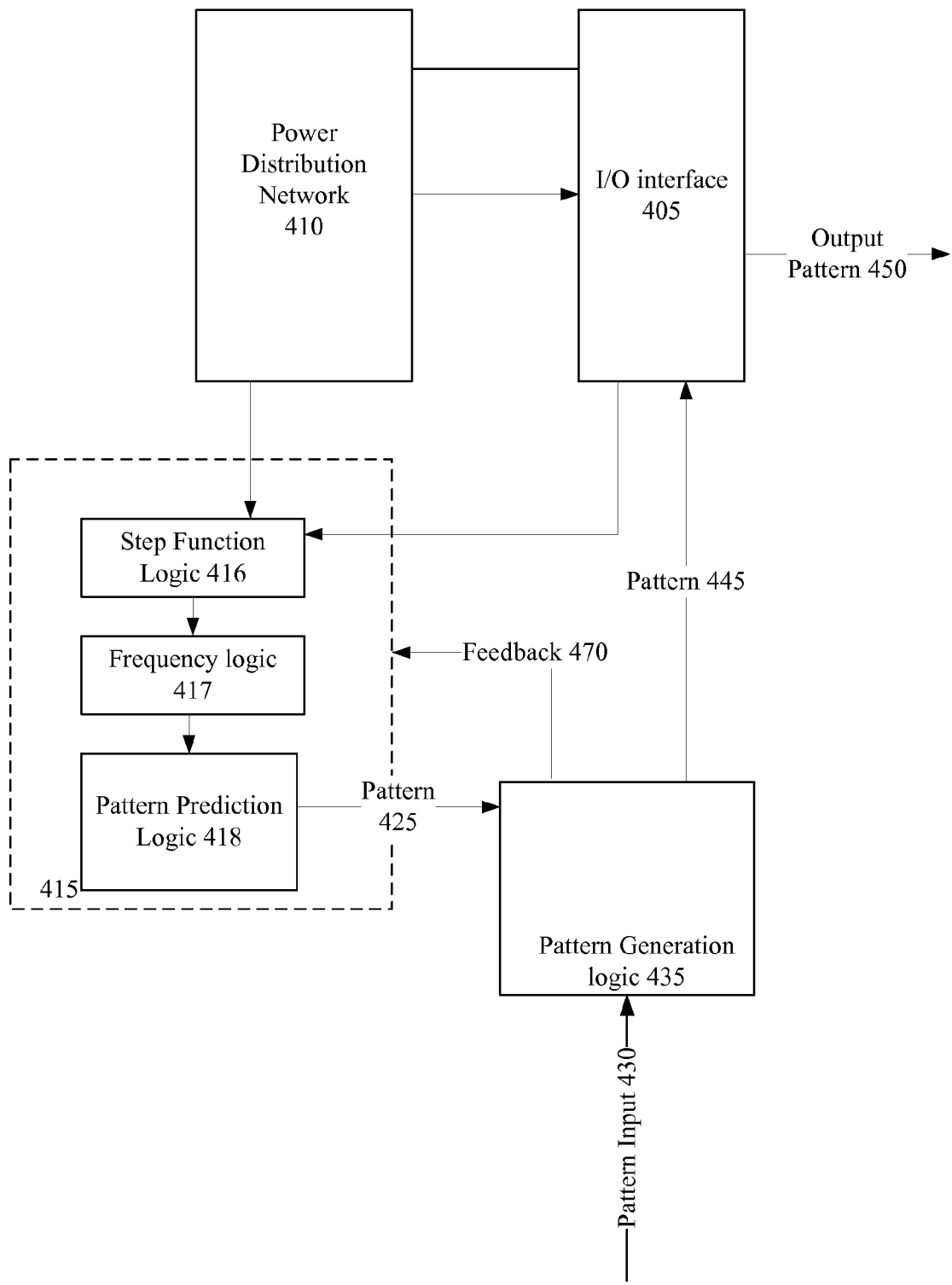
FIG. 4 illustrates another embodiment of a predicted noise reduction logic adapted to identify and avoid patterns associated with a resonant frequency that generates noise in a power distribution network for an input/output interface.
Figure 5:
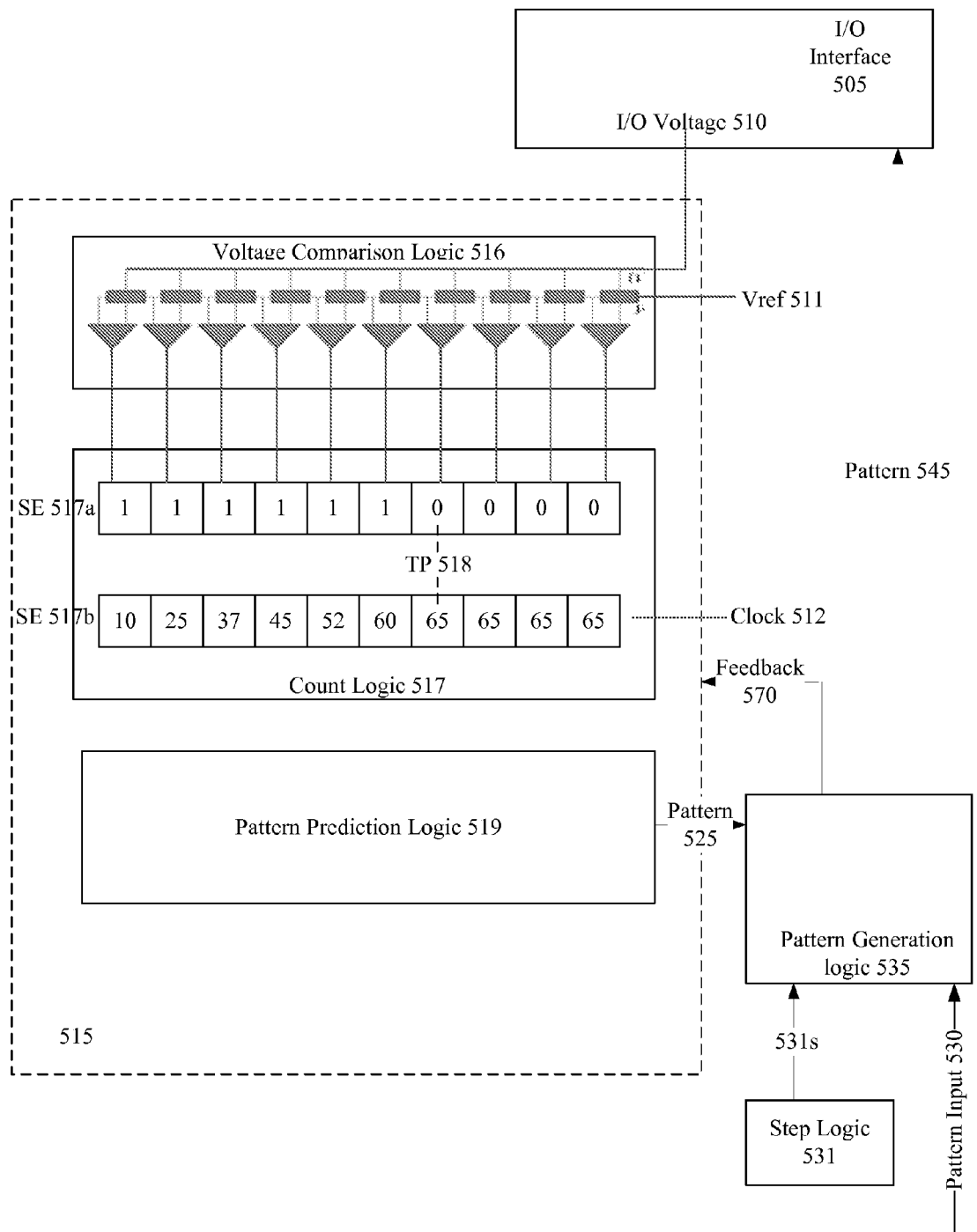
FIG. 5 illustrates another embodiment of a predicted noise reduction logic adapted to identify and avoid patterns associated with a resonant frequency that generates noise in a power distribution network for an input/output interface.

Turning to FIG. 4, another embodiment of predictive power noise reduction logic is depicted. Similar to the discussion of FIG. 2, interface 405 includes: a number of transmitter and receiver pairs to communicate on an interconnect, such as transmitting output pattern 450; a power distribution network 410 for delivering power to interface 405; and pattern generation logic 435 to receive an input pattern 430 from internal processing logic and provide a pattern to be transmitted by interface 405.

In addition, predictive noise reduction logic 415 is included to predict patterns that interface 405 is to avoid transmitting, which reduces the worst-case noise in power distribution network 410. Step function logic 416 is adapted to determining a step function response for interface 405 (i.e. a step function response for a power distribution/delivery network 410 for interface 405). In one scenario, step function logic 416, or other logic (stimuli logic that may artificially create a patter in generation logic 435 or directly affect I/O transmitters in interface 405), provide/create a step function stimuli, such as causing some or all of the transmitters in interface 405 to transition to a specific voltage (low, nominal, threshold or high voltages). In another embodiment, certain specific patterns with different logical levels are artificially generated. And the response of network 410 is characterized/profiled.

Based on the response of interface 405 including network 410, frequency logic 417 determines a resonant frequency for power distribution network 410. For example, assume the step function stimuli includes pulling all transmitters of interface 405 to a low logical level (a low voltage level). Step function logic 416, in one embodiment, determines an amount of time (cycles or other known temporal duration measurement) from the stimuli to the transmitters reaching the actual minimum voltage. Essentially, the voltage versus time—V(t)—of interface 405 is tracked/plotted. Based on that amount of time, frequency logic 417 is adapted to determine a resonant frequency of the power distribution network 410. To illustrate, a mathematical equation, such as (one) divided by (two multiplied by the amount of time), approximates the resonant frequency. In other words, a resonant frequency for network 410 is determined from the response of interface 405 to the step function stimuli.

Pattern prediction logic 418, in one embodiment, utilizes the determined resonant frequency to predict one or more patterns for interface 405 to avoid. Any known method of equating a pattern to frequency may be utilized, including a mathematically based prediction. Additionally, actual, post-silicon measurement may be utilized to characterize an impedance profile for the power distribution network, which a resonant frequency and subsequently worst-case patterns are determined from.

In the illustrated embodiment, prediction logic 418 predicts patterns, when transmitted by interface 405, cause the resonant frequency. And thereby potentially cause the worst-case noise in distribution network 410. Note that feedback may be provided from pattern generation logic 435 to pattern prediction/detection logic 418 to ensure there is no resonant frequency content in generated pattern 445 before it reaches I/O interface 405. As a result, in one embodiment, prediction logic 418 includes a feedback loop 470. Here, a first initial prediction may be made based on the step function response and determined resonant frequency. And during runtime, if a transmitted pattern causes a certain amount of measured noise in network 410 (i.e. caused the resonant frequency), that transmitted pattern is added to a list or grouping of patterns predicted by logic 418 to be avoided. Furthermore, the feedback loop 470 potentially includes feedback to any of the other illustrated blocks, such as the step function logic to dynamically adapt to any changes in the power delivery network.

Similar to the discussion of FIG. 2, patterns that are predicted to cause the determined resonant frequency are avoided. Here, when pattern generation logic 435 detects an incoming stream that includes a predicted pattern to be avoided, it manipulates the stream to avoid the predicted pattern. In its simplest form, pattern generation logic 435 includes detection logic to simply match a predicted pattern with a pattern that is provided to interface 405 for transmission. And some form of manipulation logic, such as scrambler, is used to manipulate a detected, predicted pattern. Scrambler functionality may be integrated in a current scrambler (adding the functionality of a scrambler to manipulate a pattern based on the feedback of a predicted pattern to avoid). Or logic may be implemented between a current scrambler and interface 405. Here, if scrambled pattern 445 matches a predicted pattern, then it's manipulated to avoid transmitting the predicted pattern. Yet, it is important to note that a scrambler is not required, and any known apparatus or method to avoid generating a specific pattern may be utilized. Essentially, generation logic 435 may be implemented in any manner to achieve the ultimate goal of interface 405, which includes avoiding the actual transmission of a pattern (output pattern 450) predicted to be avoided by logic 418.

Note that the discussion above focused on a step response quantified in a time domain (determining a resonant frequency from a voltage response versus time). However, the same noise reduction prediction (predicted I/O patterns to avoid) may be performed in the frequency domain. Additionally, actual, post-silicon measurement may be utilized to characterize an impedance profile for the power distribution network, which a resonant frequency and subsequently worst-case patterns are determined from. The post silicon measurement may be obtained by any known frequency domain impedance measurement technique. For example, one frequency domain technique includes modulating a core clock frequency over a desired frequency range to obtain power delivery network impedance for the frequency range, as well as resonant frequencies/worst-case patterns therefrom.

In reference to FIG. 5, another embodiment of noise reduction logic is illustrated. Note that interface 505, which includes a power delivery network (not specifically illustrated) and pattern generation logic 535 operate in a similar manner as the equivalent blocks in FIGS. 2 and 4. Here, an embodiment of step logic 531 to provide a step function stimuli is illustrated. In this case, step logic 531 provides a pattern to generation logic that is to be passed onto interface 505 as pattern 545. For example, when a stimuli includes pulling I/O's in interface 505 high, a pattern may include all logical one's. Or where the incoming pattern is inverted for transmission, all logical zero's. In another embodiment, similar logic is co-located in interface 505, such as part of the power distribution network. In this case, when I/O transmitters are to be driven high or pulled low, the stimuli is able to be directly provided to interface 505, instead of indirectly through pattern generation logic. Whether directly or indirectly, step function stimulus logic 531 may provide the discussed stimuli (directing I/O's to a specified voltage and/or logical level) in any known manner.

In the illustrated embodiment, voltage comparison logic 516 is to compare the interface logic 505's I/O voltage 510 to a specified, threshold voltage. For example, assume a stimulus of pulling I/Os low is generated. The voltage comparison logic 516, in this example, is to determine if the I/O voltage 510 reaches the minimum voltage. And count logic 517 in conjunction with comparison logic 516 is to determine when (at what point) that minimum (or other specified voltage level) is reached. Here, count logic 517 and voltage comparison logic 516 is to determine an amount of time, such as a number of cycles, from a stimulus until maximum or minimum voltages are reached.

A specific illustrative example of finding a resonant frequency of a network from a step response voltage is described. Here, comparator logic 511 finds a Time 'T', as illustrated in the step response chart 315 of FIG. 3, that the voltage goes to minimum and the next maximum voltage (i.e from minimum undershoot to a next maximum overshoot). In other words, the measured time is from maximum to minimum voltages or minimum to maximum voltages, so the voltage swing may be referred to as an amount of time between voltage extremes. In this scenario, two storage elements (not specifically illustrated) may be used to represents the minimum and maximum voltage. And a storage unit to represents the timing for each comparison. As an example, a counter runs/counts from the time all the IOs are pulled low. And to find the time 't1', in this case, where a voltage reaches the minimum, every time the voltage is lower than the comparator voltage (as determined by comparison logic 516) the corresponding bit in storage element 517a is set high (or low depending on the implementation). Consequently, SE 517a is filled with high logical values up to the minimum voltage of the system. At the same time the SE517b is filled with corresponding timestamps at each comparison in the count logic 517. The counter value corresponding to the time 't1'(transition point 518) is saved, and in one embodiment, SE 517a and SE517b are reset. When the voltage ramps up, each comparator now sets SE517a high if the voltage is greater than the compared voltage. Once the maxima is reached the counter value (second T, i.e. 'T2') is recorded. The difference between times (T=t2−t1) provides time T to determine a resonant frequency from equation 1 below.

$$f = 1/2T \qquad \text{Equation 1}$$

To provide another perspective of the illustrative example, two storage elements (SE 517a and 517b), such as registers, are included in count logic 517. Here, SE 517a represent a point at which the end voltage levels, such as a minimum or maximum voltages, are reached. And SE 517b indicates a time/number of cycles that elapsed to that corresponding point. In this case, a first logical level (illustrated as a logical one) is shifted (written) into SE 517a until an end voltage (such as a minimum voltage) is reached; at which time a time t1, as above is determined. As depicted, this point at which the end voltages (such as a minimum voltage) are reached is referred to as transition point 518 (i.e. transition point 't1'). Similarly, values in SE 517b correspond to the entries of SE 517a and include an amount of elapsed time, such as a number of cycles (i.e. timestamps of associated measurements). For example, assume a counter is reset to zero and starts counting once per cycle from the initiation of the stimulus (pulling all I/Os low). As can be seen in the illustrative example of FIG. 5, the number of elapsed cycles from left to right include: 10, 25, 37, 45, 52, 60, and 65; at which point transition point 518 in SE 517a indicates the time or cycles when end voltages, such as minimum voltages are reached. In other words, in the illustrated example, it was 65 cycles from the stimulus until a minimum voltage was reached. And the same process is repeated for determining a next maxima of voltage to obtain a second transition point at time t2, such as another 65 cycles later (an absolute time of 130 cycles). Using equation 1 from above, a resonant frequency (1/[2*(130−65 cycles in time]) is able to be determined.

Note that the included cycle numbers are purely illustrative. And any temporal measurement may be utilized to measure the period between a system reaching minimum and maximum voltages after a stimulus. The combination of voltage comparison logic 516 and count logic 517 may also be referred to as a specific type of analog to digital converter, such as a flash comparator. As a result, any equivalent structure may be utilized to characterize a power distribution network.

In one embodiment, pattern prediction logic 519 is to predict one or more patterns to avoid based on the output from the flash comparator (516, 517). As an example, a resonant frequency is determined from voltage in comparison to time (the time domain). Here, a resonant frequency is determined from the amount of time, as measured by count logic 517, between reaching end voltages, such as an amount of time between minimum and maximum voltages (an illustrative example shown in chart 315.

And based on that resonant frequency, I/O patterns that are determined to generate the resonant frequency are predicted to be avoided. As aforementioned, such predicted patterns, such as pattern 525, are avoided by interface 505 (e.g. a scrambler scrambles input pattern 530 into pattern 545 if incoming pattern 530 matches predicted pattern 525). However, a scrambler is not required, but is instead only an illustrative example of how to avoid a predicted pattern. Also note that generation logic may be included in interface 505, which was described above. Moreover, a resonant frequency may also be determined by alternative logic and methods, such as stepping clock frequency to determine an impedance profile interface 505 as aforementioned.

Figure 6:
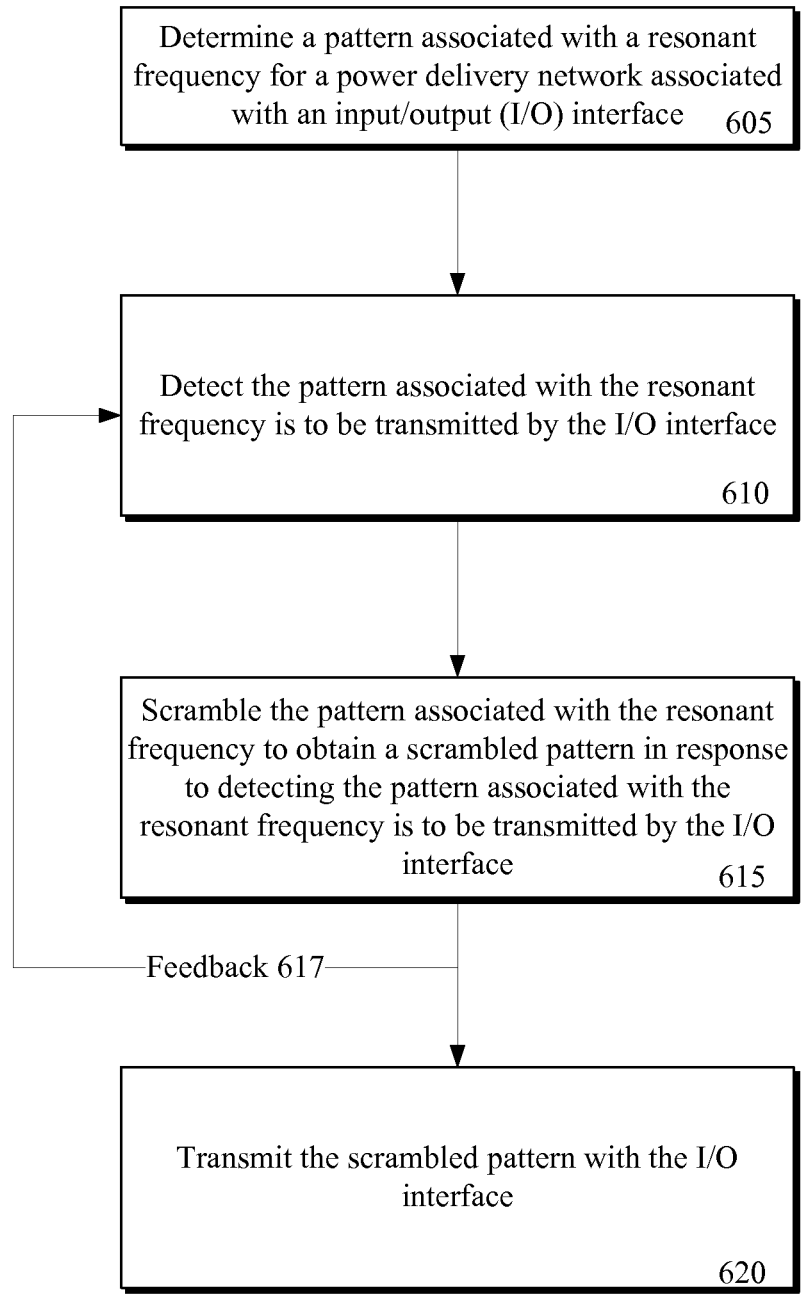
FIG. 6 illustrates an embodiment of a flow diagram for a method of predicting patterns to avoid for reduction of noise in a power distribution network.

Referring next to FIG. 6, an embodiment of a flow diagram for a method of reducing noise in a power distribution network is illustrated. Although the flows of FIG. 6 are illustrated in a substantially serial fashion, the flows may be performed in a different order, as well as in parallel. Additionally, the illustrated flows are not required to be performed. And other flows not depicted may be included.

In flow 605, a pattern associated with a resonant frequency for a power delivery network associated with an input/output (I/O) interface it is determined. As described above, in one embodiment, is a step function stimuli is provided to an interface. The response of a power delivery network associated with the interface is determined. And from that response, a resonant frequency of the power delivery network is also determined. Based on the resonant frequency, one or more patterns are predicted to be avoided. However, any known method of characterizing a power delivery network or obtaining a resonant frequency of a power distribution network may be utilized. And then any known method of determining a pattern that causes such a resonant frequency may also be used.

Next, in flow 610, the pattern associated with the resonant frequency is detected to be transmitted by the interface. For example, an incoming pattern to be transmitted by the interface is compared against predicted patterns. When a match is found, the pattern associated with the resonant frequency is scrambled or manipulated to obtain a scrambled pattern. And in flow 620, the scrambled pattern is transmitted by the interface, instead of the pattern associated with the resonant frequency that would potentially cause a worst-case noise scenario within the power distribution network. Although not illustrated, receiving logic, in this embodiment, is adapted to understand and descramble the scramble pattern to obtain the appropriate information. Consequently, worst case noise scenarios are potentially avoided, which allows for designers and OEMs to place less capacitors per part; this optimization results in more processor die space a reduction in per unit cost. Note that feedback may be provided from pattern generation logic to pattern prediction/detection logic to ensure there is no resonant frequency content in generated pattern before it reaches an I/O interface. As a result, in one embodiment, feedback loop 417 is included.

In addition, since parts (processors) and platforms vary across products, each interface and power delivery network is unique in its characteristics. As a result, a simulation or other generic solution doesn't address the individuality of the characteristics of each platform, such as potential differing resonant frequencies across different parts of even the same product line. Yet, the apparatus' and methods described herein include actual characterization of each network in a platform to take into account such individual characteristics. As a result, the apparatus' and methods described herein may be implemented across each platform in the same manner, but they provide an adaptive, flexible approach to predicting and reducing noise in a power delivery network that address the problem across platforms in the correct, individualized manner.

A module as used herein refers to any hardware, software, firmware, or a combination thereof. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices. However, in another embodiment, logic also includes software or code integrated with hardware, such as firmware or micro-code.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible or machine readable medium which are executable by a processing element. A machine-accessible/readable medium includes any mechanism that provides (i.e., stores and/or transmits) information in a form readable by a machine, such as a computer or electronic system. For example, a machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding propagated signals (e.g., carrier waves, infrared signals, digital signals); etc.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
an input/output (I/O) interface;
a power delivery network coupled with the I/O interface, the power delivery network including at least some hardware;
power characterization logic including hardware and adapted to characterize the power delivery network to obtain a mathematical function response associated with the I/O interface, wherein the power characterization logic comprises step function logic to cause a step function stimuli associated with the I/O interface and to determine a step function response responsive to the step function stimuli; and
prediction logic including hardware and adapted to predict an I/O pattern to avoid based on the mathematical function response associated with the I/O interface.

2. The apparatus of claim 1, wherein the step function stimuli is selected from a group consisting of driving all I/O data transmitters of the I/O interface to a high voltage level, pulling all I/O data transmitters of the I/O interface to a low logic level, and setting all I/O data transmitters of the I/O interface to a nominal voltage level.

3. The apparatus of claim 1, wherein the prediction logic adapted to predict an I/O pattern to avoid based on the mathematical function response associated with the I/O interface comprises:
frequency determination logic adapted to determine a resonant frequency for the I/O interface based on the step function response; and
pattern logic adapted to determine the I/O pattern to avoid based on the resonant frequency.

4. The apparatus of claim 3, wherein the pattern logic is adapted to determine the I/O pattern to avoid based on the resonant frequency comprises: the pattern logic being adapted to determine the I/O pattern, when transmitted by the I/O interface, causes the resonant frequency.

5. The apparatus of claim 1, wherein the prediction logic adapted to predict the I/O pattern to avoid based on the mathematical function response associated with the I/O interface comprises:
time logic adapted to determine a time from reaching a minimum voltage to reaching a maximum voltage; and
pattern logic adapted to determine the I/O pattern to avoid based on reaching a minimum voltage to reaching a maximum voltage.

6. The apparatus of claim 1, further comprising: scrambler logic adapted to detect the I/O pattern and to scramble the I/O pattern before the I/O interface is to transmit the I/O pattern in response to the prediction logic predicting the I/O pattern is to be avoided.

7. An apparatus comprising:
a power delivery network including at least some hardware;
step function response logic adapted to determine a step function response associated with an input/output (I/O) interface;
frequency logic coupled to the step function response logic, the frequency logic being adapted to determine a resonant frequency associated with the step function response;
pattern prediction logic including transistor and coupled to the frequency logic, the pattern prediction logic being adapted to determine at least one I/O pattern associated with the resonant frequency; and
pattern generation logic including transistors and coupled to the pattern prediction logic, the pattern generation logic being adapted to manipulate the least one I/O pattern associated with the resonant frequency in response to detecting the at least one I/O pattern is to be transmitted by the I/O interface.

8. The apparatus of claim 7, wherein the step function response logic adapted to determine a step function response associated with an I/O comprises: stimuli logic adapted to pull the I/O interface to a voltage level; and voltage comparison logic coupled to temporal logic adapted to determine an amount of time associated with reaching a maximum voltage from a minimum voltage in response to the I/O logic reaching the voltage level.

9. The apparatus of claim 8, wherein the temporal logic comprises a first register adapted to shift in bits at a first logical level until the I/O logic reaches the voltage level and to subsequently shift in bits at a second logical level after the I/O logic reaches the voltage level; and a second register adapted to shift in a representation of a time that corresponds to each of the bits shifted into the first register, and wherein the temporal logic being adapted to determine an amount of time associated with I/O logic reaching the voltage level comprises the temporal logic being adapted to determine a first time associated with reaching a minimum voltage from a first representation of the time held in the second register that corresponds to a first bit that includes a first transition in the first register from the first logical level to the second logical level, determine a second time associated with reaching a maximum voltage from a second representation of the time held in the second register that corresponds to a second bit that includes a second transition in the first register from the first logical level to the second logical level, and determine the amount of time from the difference between the first and second representation of time.

10. The apparatus of claim 8, wherein the frequency logic adapted to determine a resonant frequency associated with the step function response comprises: the frequency logic being adapted to determine the resonant frequency based on the amount of time between the I/O voltage reaching a maximum voltage level from a minimum voltage level.

11. The apparatus of claim 10, wherein the frequency logic being adapted to determine the resonant frequency based on the amount of time associated with the I/O logic reaching the voltage level comprises: the frequency logic being adapted to implement a mathematical expression including one divided by two multiplied by the amount of time.

12. The apparatus of claim 7, wherein pattern generation logic adapted to manipulate the least one I/O pattern associated with the resonant frequency in response to detecting the at least one I/O pattern is to be transmitted by the I/O interface comprises: the pattern generation logic being adapted to scramble the at least one I/O pattern in response to detecting the at least one I/O pattern.

13. An integrated circuit comprising:
an input/output (I/O) interface including a plurality of I/O cells;
step logic including hardware and coupled with the I/O interface, and including hardware, and adapted to cause a step stimuli associated with the plurality of I/O cells;
count logic including hardware and adapted to determine an amount of time between voltage extremes associated with the I/O interface in response to the step stimuli associated with the plurality of I/O cells; and
prediction logic including hardware and adapted to determine an I/O pattern to avoid based on the amount of time.

14. The integrated circuit of claim 13, further comprising voltage comparison logic adapted to determine when the voltage extremes are reached.

15. The integrated circuit of claim 13, wherein the step stimuli associated with the plurality of I/O cells comprises: pulling the plurality of I/O cells to an end voltage.

16. The apparatus integrated circuit of claim 15, wherein the amount of time includes a number of cycles between voltage extremes associated with the I/O interface.

17. The integrated circuit of claim 13, wherein the count logic adapted to determine the amount of time comprises: a first storage element adapted to indicate a first point at which the plurality of I/O cells reach a first voltage extreme and a second point at which the plurality of I/O cells reach a second voltage extreme; and a second storage element adapted to indicate a first time corresponding to the first point and a second time corresponding to the second point, wherein the amount of time includes a difference in time between the second point and the first point.

18. The apparatus integrated circuit of claim 13, wherein the prediction logic adapted to determine an I/O pattern to avoid based on the amount of time comprises:
frequency logic adapted to determine a resonant frequency based on the amount of time and pattern logic adapted to determine the I/O pattern based on the resonant frequency.

19. A method comprising:
providing output signals from an input/output (I/O) interface;
delivering power to the I/O interface with a power delivery network;
determining a pattern associated with a resonant frequency for the power delivery network associated with the I/O interface;
detecting the pattern associated with the resonant frequency is to be transmitted by the I/O interface wherein the detecting the pattern is performed with logic of a processor that includes at least some hardware; and
avoiding transmitting the pattern associated with the resonant frequency with the I/O interface in response to detecting the pattern associated with the resonant frequency is to be transmitted by the I/O interface.

20. The method of claim 19, wherein determining the pattern associated with resonant frequency for the power delivery network associated with the interface comprises:
initiating a pull down of the interface to a low logical level;
determining a first time for the interface to reach a minimum voltage level associated with the low-logical level;
determining a second time for the interface to reach a next maximum voltage level associated with the low logical level;
determining an amount of time from the first time to the second time;
determining the resonant frequency based on the amount of time; and
determining the pattern, when transmitted by the interface, generates the resonant frequency for the power network associated with the interface.

21. The method of claim 19, wherein determining the pattern associated with resonant frequency for the power delivery network associated with the interface is performed by a flash comparator.

22. The method of claim 19, further comprising:
determining a plurality of additional patterns are also associated with the resonant frequency for the power delivery network associated with the interface; and
avoiding one of the plurality of additional patterns associated with the resonant frequency with the power delivery network in response to detecting the one of the plurality of additional patterns is to be transmitted by the interface.

* * * * *

UNITED STATES PATENT AND TRADEMARK OFFICE
CERTIFICATE OF CORRECTION

PATENT NO. : 9,329,656 B2  
APPLICATION NO. : 14/223941  
DATED : May 3, 2016  
INVENTOR(S) : Satish Prathaban et al.

Page 1 of 1

It is certified that error appears in the above-identified patent and that said Letters Patent is hereby corrected as shown below:

Title Page, item (54), in column 1, in "Title", line 2, delete "PREDICITVE" and insert -- PREDICTIVE --, therefor.

In the Specification

In column 1, line 2, delete "PREDICITVE" and insert -- PREDICTIVE --, therefor.

In the Claims

In column 15, line 63, in claim 16, after "The" delete "apparatus".

In column 16, line 12, in claim 18, after "The" delete "apparatus".

Signed and Sealed this
Nineteenth Day of July, 2016

Michelle K. Lee
*Director of the United States Patent and Trademark Office*